(12) United States Patent
Frasch et al.

(10) Patent No.: US 7,377,415 B2
(45) Date of Patent: May 27, 2008

(54) BOND HEAD LINK ASSEMBLY FOR A WIRE BONDING MACHINE

(75) Inventors: E. Walter Frasch, Perkasie, PA (US); Richard D. Sadler, Quakertown, PA (US); Michael P. Schmidt-Lange, North Wales, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 575 days.

(21) Appl. No.: 11/152,861

(22) Filed: Jun. 15, 2005

(65) Prior Publication Data

US 2006/0283911 A1    Dec. 21, 2006

(51) Int. Cl.
B23K 37/00 (2006.01)
B23K 31/00 (2006.01)
B23K 31/02 (2006.01)

(52) U.S. Cl. ..................... 228/4.5; 228/180.5
(58) Field of Classification Search .................. 228/4.1, 228/4.5, 5.1, 5.5, 5.7, 6.1, 6.2, 180.5
See application file for complete search history.

(56) References Cited

U.S. PATENT DOCUMENTS

| | | |
|---|---|---|
| 3,938,797 A | 2/1976 | Frederick |
| 4,326,115 A | 4/1982 | Bartholet et al. |
| 4,340,166 A | 7/1982 | Bilane et al. |
| 4,444,349 A | 4/1984 | Bilane et al. |
| 4,598,853 A | 7/1986 | Hill |
| 4,976,392 A | 12/1990 | Smith et al. |
| 5,114,302 A | 5/1992 | Meisser et al. |
| 5,150,040 A | 9/1992 | Byrnes et al. |
| 5,174,489 A | 12/1992 | Mason |
| 5,193,330 A | 3/1993 | Nusser |
| 5,871,136 A | 2/1999 | Miller et al. |
| 5,893,509 A | 4/1999 | Pasquier |
| 6,164,514 A | 12/2000 | Miller et al. |
| 6,176,414 B1 | 1/2001 | Sadler |
| 6,623,235 B2 | 9/2003 | Yokota et al. |
| 6,863,206 B2 | 3/2005 | Kyomasu et al. |
| 7,306,132 B2 | 12/2007 | Kakutani et al. |

*Primary Examiner*—Jerry A. Lorengo
*Assistant Examiner*—Megha Mehta
(74) *Attorney, Agent, or Firm*—Christopher M. Spletzer, Sr.

(57) ABSTRACT

A bond head assembly for use with a bonding machine includes a wire bonding tool and a link mechanism coupled between the wire bonding tool and the wire bonding machine. The link mechanism includes a frame, a plurality of arm links pivotably connected to the frame, and a tool support member supporting the wire bonding tool and pivotably connected to each of the arm links.

8 Claims, 7 Drawing Sheets

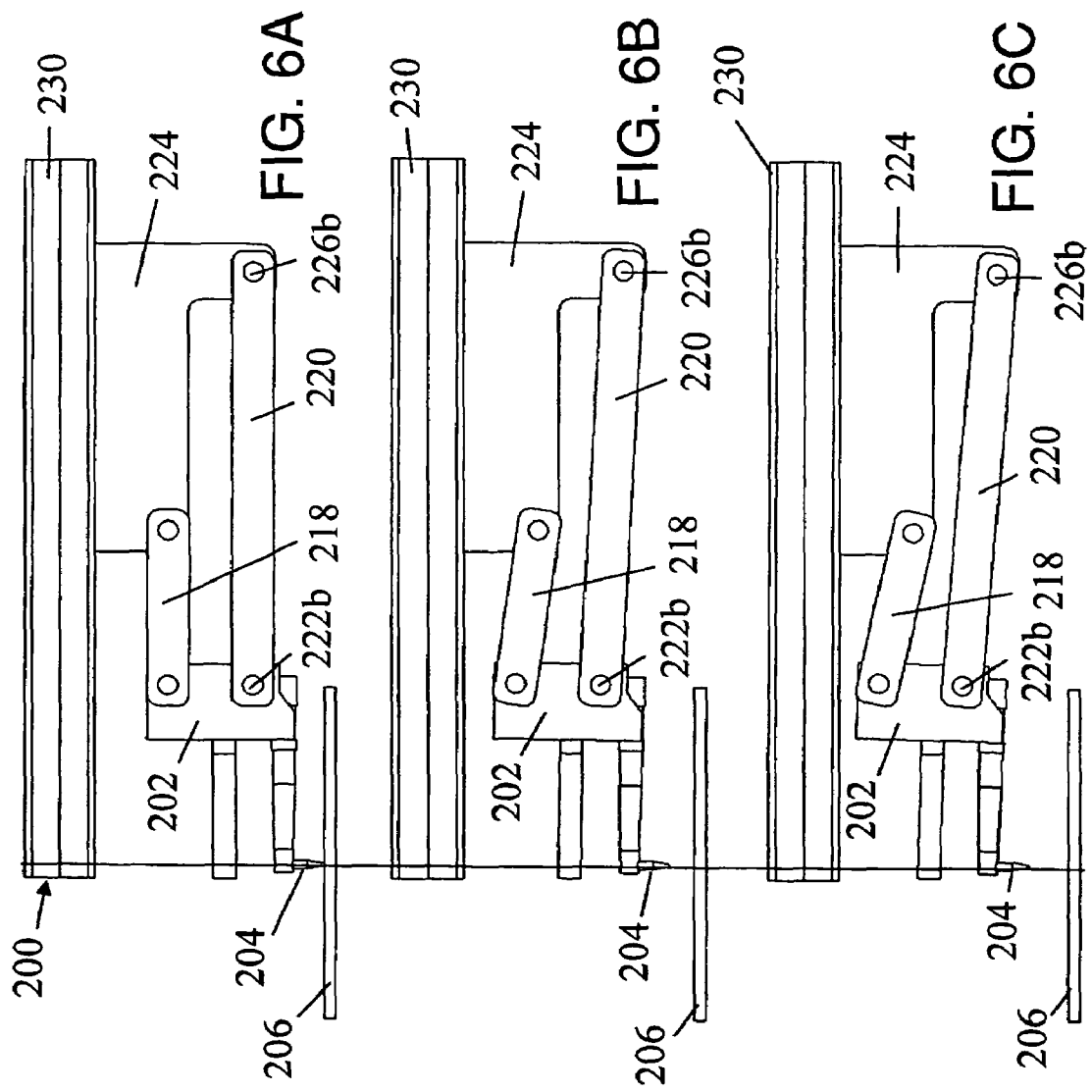

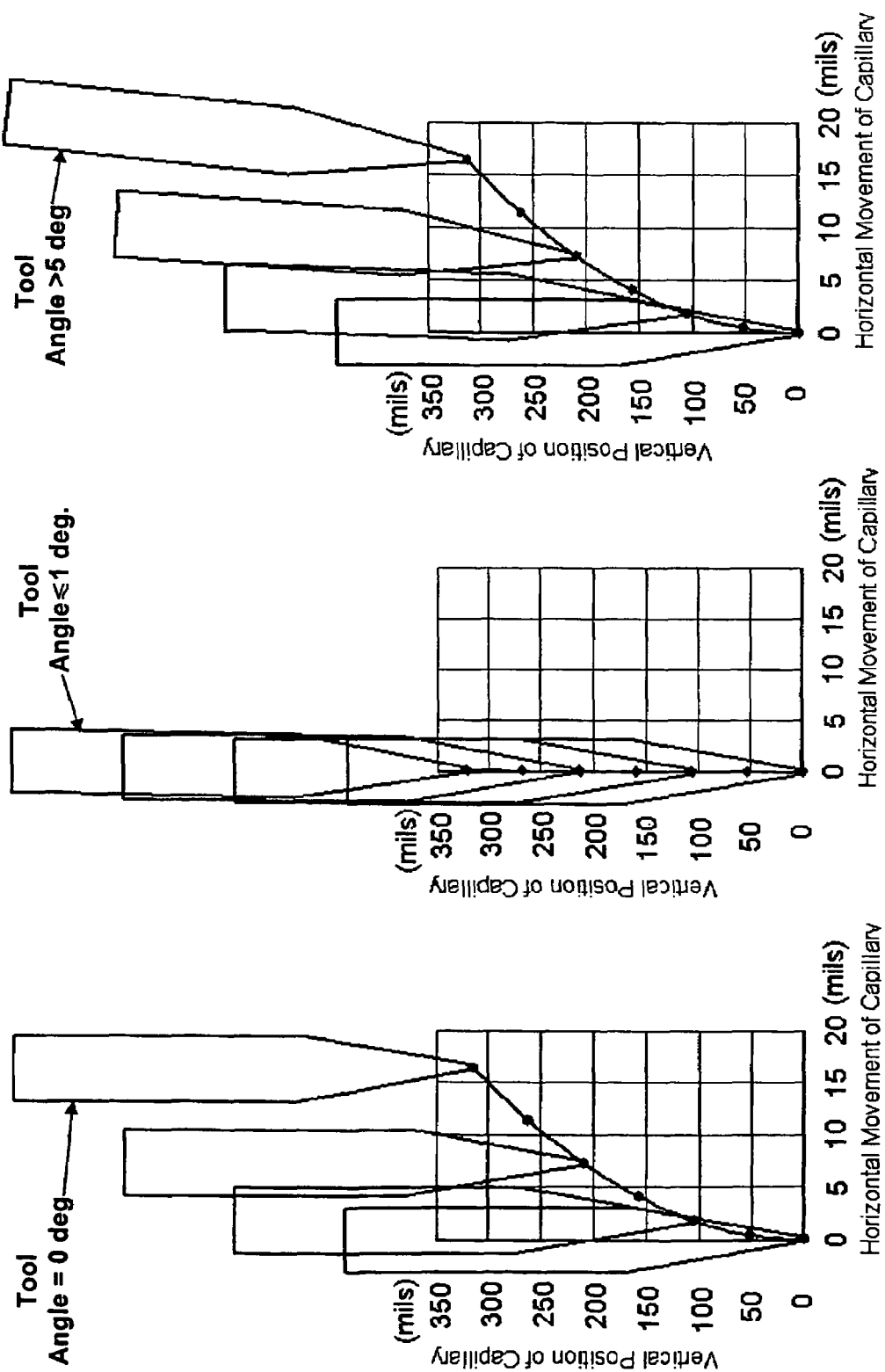

BOND HEAD LINK ASSEMBLY FOR A WIRE BONDING MACHINE

FIELD OF THE INVENTION

The present invention relates to wire bonding apparatuses, and more particularly, to a link assembly for a wire bonding machine.

BACKGROUND OF THE INVENTION

Wire bonding machines typically include a wire bonding tool, such as a capillary, which receives a metal wire to be bonded by the wire bonding machine. One example of the use of bonded wire is for electrically connecting a semiconductor device (e.g., a die) to a substrate (e.g., a circuit board). In certain wire bonding machines, the capillary is raised and lowered with respect to a work piece by a bond head during the wire bonding process. The vertical motion of the bonding tool also provides access to an end of the wire in a ball-bonding process to form a free-air ball.

Certain conventional wire bonding machines include a tool arm that supports the capillary adjacent one end of the arm. The tool arm is pivotably supported adjacent an opposite end for pivoting about a horizontal axis. The pivoting of the tool arm about the horizontal axis provides the desired vertical (Z-axis) movement of the wire bonding tool. The motion of the tool, however, is along an arc such that it includes both horizontal and vertical components. If linear motion (e.g., vertical only) is desired, the tool arm may be simultaneously translated. The pivoting of the tool arm undesirably causes an associated pivoting of the supported tool. Such tool pivot results in inconsistent looping profiles.

The bondable area for certain conventional wire bonding machines is limited by interference between the work piece and supporting structure for the tool support arm, which is located at or below the location of the tool support arm. The coverage area for such wire bonding machines, therefore, is limited by the length of the tool support arm. The potential reach by the conventional wire bonding machine is sometimes referred to as the "throat" of the machine.

Certain wire bonding machines include a link mechanism for raising and lowering a wire bonding tool with respect to a work piece. The link mechanism includes a tool support member and a pair of arm links pivotably connected to the tool support member and supported from above. The arm links are oblique to each other such that virtual extension lines intersect at a point below the tool support member, thereby minimizing interference to promote increased throat. The motion of the tool support member during the movement of the mechanism, however, includes both horizontal and vertical components. The tool support member is also pivoted during the mechanism movement.

Thus, it would be desirable to provide a wire bonding machine including a mechanism for raising and lowering a wire bonding tool overcoming certain of the deficiencies related to conventional wire bonding machines.

SUMMARY OF THE INVENTION

According to an exemplary embodiment of the present invention, a bond head assembly for use with a bonding machine comprises a wire bonding tool and a link mechanism coupled between the wire bonding tool and the wire bonding machine. The link mechanism includes a frame, a plurality of arm links pivotably connected to the frame, and a coupler link pivotably connected to each of the arm links. The coupler link supports the wire bonding tool. The arm links of the mechanism are substantially parallel to each other in at least one position of the link mechanism within a range of motion of the link mechanism.

According to another exemplary embodiment of the present invention, a link assembly for a wire bonding machine comprises a frame, a pair of pivot links and a tool support member supporting a wire bonding tool. The pair of pivot links are pivotably connected to the frame and the tool support member is pivotably connected to each of the pivot links. The frame, pivot links and tool support member define a link mechanism in which the pivot links pivot in the same angular direction to provide substantially constant angular orientation of the tool support member.

According to another exemplary embodiment of the present invention, a link assembly for raising and lowering a wire bonding tool of a wire bonding machine with respect to a work piece is provided. The link assembly comprises a frame, a pair of substantially parallel pivot members, and a tool support member supporting the wire bonding tool. The pivot members are pivotably connected to the frame and the tool support member is pivotably connected to each of the pivot members to define a four-bar mechanism. The pair of pivot members are substantially parallel to each other in at least one position of the four-bar mechanism within a range of motion of the four-bar mechanism.

According to another exemplary embodiment, a linkage mechanism for vertically displacing a wire bonding tool of a wire bonding machine comprises a tool support member adapted for supporting the wire bonding tool, and first and second arms. Each of the arms is pivotably connected to a frame of the wire bonding machine and to the tool support member at first and second locations of the arm. A pivot length for each of the arms is defined between the first and second locations of the arm. The pivot length of the first arm provides a trajectory for the second location of the first arm having vertical and horizontal components. The pivot length of the second arm is less than that of the first arm to cause pivoting of the tool support member with respect to the frame. The pivoting of the tool support member results in a tool pivot motion of the tool with respect to the first arm that includes a horizontal component. The horizontal components of the first arm trajectory and the tool pivoting motion are substantially equal and opposite to each other to provide substantially linear movement of the wire bonding tool.

According to another exemplary embodiment, a method for configuring a linkage mechanism of a wire bonding machine is provided. The method includes the step of determining a desired amount of vertical displacement for the wire bonding tool. A tool support member adapted to support the wire bonding tool is provided. First and second arms each adapted for pivotable connection to a frame of the wire bonding machine and to the tool support member at first and second locations of the arm are also provided. The method also includes the step of determining a first arm pivot length defined between the first and second locations of the first arm to provide a preselected trajectory for the second location of the first arm. The method includes the step of determining a second arm pivot length selected to cause pivoting of the tool support member with respect to the frame of the wire bonding machine by a preselected pivot angle.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 6A through 6C are side elevation views of the bond head assembly of FIG. 5 showing the bond head assembly in different positions.

FIGS. 7A through 7C are graphical illustrations showing tool pivot and horizontal tool movement for the bond head assembly of FIG. 1, the bond head assembly of FIG. 5, and a bond head assembly of a prior wire bonding machine, respectively.

DETAILED DESCRIPTION OF THE DRAWINGS

The present invention relates to wire bonding machines used for bonding wire to a work piece. The term "work piece" is meant broadly to include semiconductor devices, such as dies and chips as well as substrates, such as printed circuit boards and lead frames, to which the semiconductor devices are electrically connected by the bonded wire.

As used herein, the term "wire bonding tool" refers to any tool of a wire bonding machine (e.g., a capillary tool) receiving a bonding wire and adapted to bond the wire to a work piece.

As used herein, the term "bond head" refers to any structure of a wire bonding machine supporting a wire bonding tool.

As used herein, the term "closed-loop link assembly" refers to a series of substantially rigid members interconnected by joints to form a closed chain.

As used herein, the term "link mechanism" refers to a link assembly in which two or more links of the assembly are movable with respect to a fixed link.

As used here, the term "planar link mechanism" refers to a link mechanism in which the motion of the mechanism is generally planar. The term is not meant to be limited to mechanisms including substantially planar bar or plate members. Thus, the link members could have substantial dimensions extending transversely to the plane of motion.

As used herein, the terms "frame" or "frame link" refers to a fixed link of a link mechanism.

As used herein, the term "four-bar linkage" refers to a closed-loop link assembly including a frame, a pair of side links pivotably connected to the frame, and a coupler link pivotably connected to each of the side links.

As used herein, the terms "coupled to", "coupled between", and "connected to" are meant to broadly cover both elements directly connected together as well as elements interconnected by one or more intermediate elements.

Figure 1:
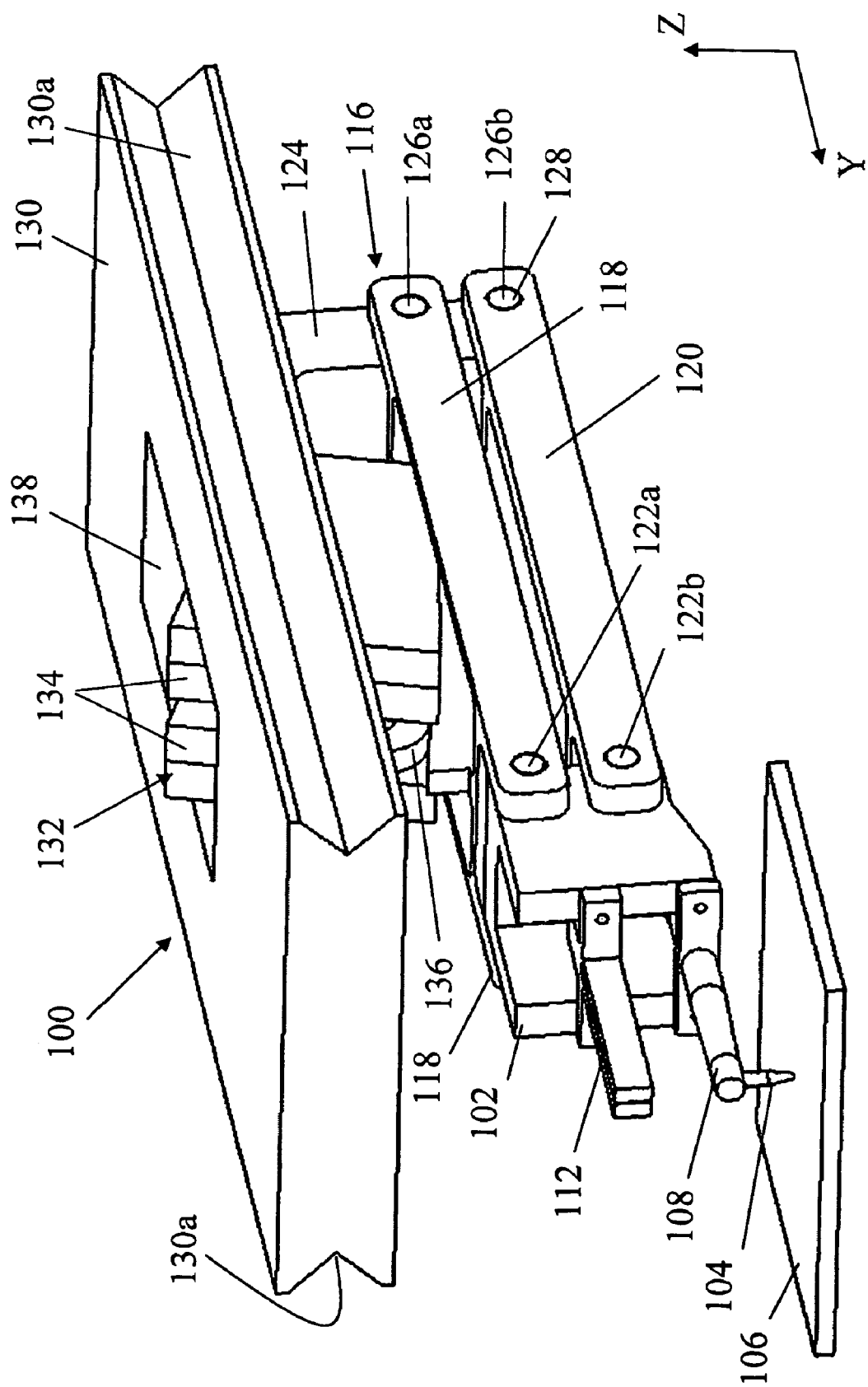
FIG. 1 is a perspective view of a bond head assembly for a wire bonding machine according to an exemplary embodiment of the invention, the assembly in a lowered position with respect to a work piece.

Referring to the drawings where like numerals refer to like elements, there is illustrated in FIG. 1 a bond head assembly 100 for use with a wire bonding machine according to a first exemplary embodiment of the invention. The bond head assembly 100 includes a tool support member 102 for supporting a wire bonding tool, such as capillary 104 shown in the depicted embodiment and provides a mechanism for moving the wire bonding tool 104 with respect to an underlying work piece 106 between raised and lowered positions. As described below in greater detail, the bond head assembly 100 supports the wire bonding tool 104 from a location above the tool 104. This arrangement desirably provides increased throat for the wire bonding machine compared to conventional wire bonding machines in which support structure is located at or below the wire bonding tool. In addition, the mechanism of the first exemplary embodiment desirably maintains orthogonality between the wire bonding tool and a work piece throughout a range of motion of the mechanism.

The capillary 104 of the depicted embodiment is supported by a transducer 108, which is secured to the tool support member 102 adjacent a lower end of the tool support member 102. Preferably, the transducer 108 is secured to the tool support member 102 using fasteners. However, any suitable means of securing the transducer 108 could be used, such as welding for example. The transducer 108 engages the capillary 104 and transmits vibrational energy to the capillary 104 to facilitate bonding interaction between the bond wire and a semiconductor device or substrate. Transducers are, per se, well known and, therefore, no further description is required.

The bond head assembly 100 also includes a wire clamp 112 secured to the tool support member 102 above the capillary 104 and transducer 108. The wire clamp 112 is adapted to receive a bond wire from a wire feed system (not shown) and direct the wire vertically downward to the capillary 104. The wire clamp 112 is adapted to respectively engage and release the bond wire to disable or enable the payout of the bond wire from the capillary 104. The wire clamp 112 is per se known and, therefore, no further description is required.

The tool support member 102 forms part of a link assembly 116 that also includes upper and lower arm links 118, 120. The upper and lower arm links 118, 120 are preferably arranged such that they are substantially parallel to each other. The upper and lower arm links 118, 120 are pivotably connected to the tool support member 102 for pivot about pivot axes at 122a, 122b, respectively. The upper and lower arm links 118, 120 are preferably connected to the tool support member 102 on each of opposite sides of the tool support member 102.

The link assembly 116 of bond head assembly 100 also includes a link support member 124. The upper and lower arm links 118, 120 of the link assembly 116 are pivotably connected to the link support member 124 for pivot about pivot axes at 126a, 126b, respectively. The link support member 124 provides a frame for the link assembly 116 that is fixed with respect to the bond head assembly 100. The term "fixed" as applied to the frame of the link assembly 116 refers to the angular orientation of the frame with respect to the pivoting action of the arm links 118, 120. The frame, therefore, may be free to translate or otherwise move in varying directions.

The link assembly 116 is a closed-loop link assembly, which is an assembly of substantially rigid members interconnected at joints to form a closed chain: The link assembly 116 defines a type of closed-loop link assembly known as a four-bar mechanism, which is a planar mechanism having three-members that are movable with respect to the fixed frame. The moving members include a pair of pivot links pivotably connected to the frame at spaced locations for pivot about separate pivot axes. The other moving member, sometimes referred to as a coupler link, is pivotably connected to each of the pivot links. When the pivot links of the four-bar mechanism are substantially parallel, which is an arrangement sometimes referred to as a parallelogram mechanism, the angular orientation of the coupler link will remain constant during pivoting of the pivot links.

As applied to the link assembly 116 of bond head assembly 100, which is a parallelogram mechanism, tool support member 102 and arm links 118, 120 respectively define the coupler link and pivot links of the mechanism. The arm link support member 124 of bond head assembly 100, which is fixed with respect to the pivoting action of the mechanism, defines the frame of the parallelogram mechanism. As may be seen by comparing FIGS. 2 and 4, the arm links 118, 120 remain substantially parallel to each other, and the angular orientation of tool support member 102 remains substantially constant, throughout a range of motion of the mechanism between the lowered and raised positions.

The depicted bond head assembly 100 includes connector means 128 providing relative pivot between the members of the link assembly 116 at pivot locations 122a, 122b, 126a, 126b. The connector means 128 may include pins or threaded fasteners such as screws, studs, bolts and nuts to provide for a detachable connection, or rivets where a more permanent attachment is desired. Although the depicted bond head assembly 100 includes connector means 128 at the pivot locations to provide the desired relative pivot, the invention is not so limited. Any suitable means of providing relative pivot between substantially rigid members could be used.

The depicted bond head assembly 100 is mounted to a slide member 130 of a linear slide mechanism for translating the tool support member 102 with respect to the work piece 106 along a horizontal axis, such as the Y-axis. The slide member 130 defines V-shaped grooves 130a along each of opposite sides for supporting the slide member. Linear slide mechanisms are, per se, known and, therefore, needs no further description. The link support member 124 extends downwardly and substantially rigidly from a lower surface of slide member 130 to provide the pivotable support for the upper and lower arm links 118, 120 at the pivot locations 126a, 126b.

Although the depicted bond head assembly 100 is shown mounted to a linear slide mechanism to provide horizontal translation of the wire bonding tool 104 with respect to work piece 106, the invention is not so limited. Other means of providing horizontal tool movement could be used such as an X-Y positioning device or by pivoting a portion of the wire bonding machine about a vertical axis.

Figure 2:
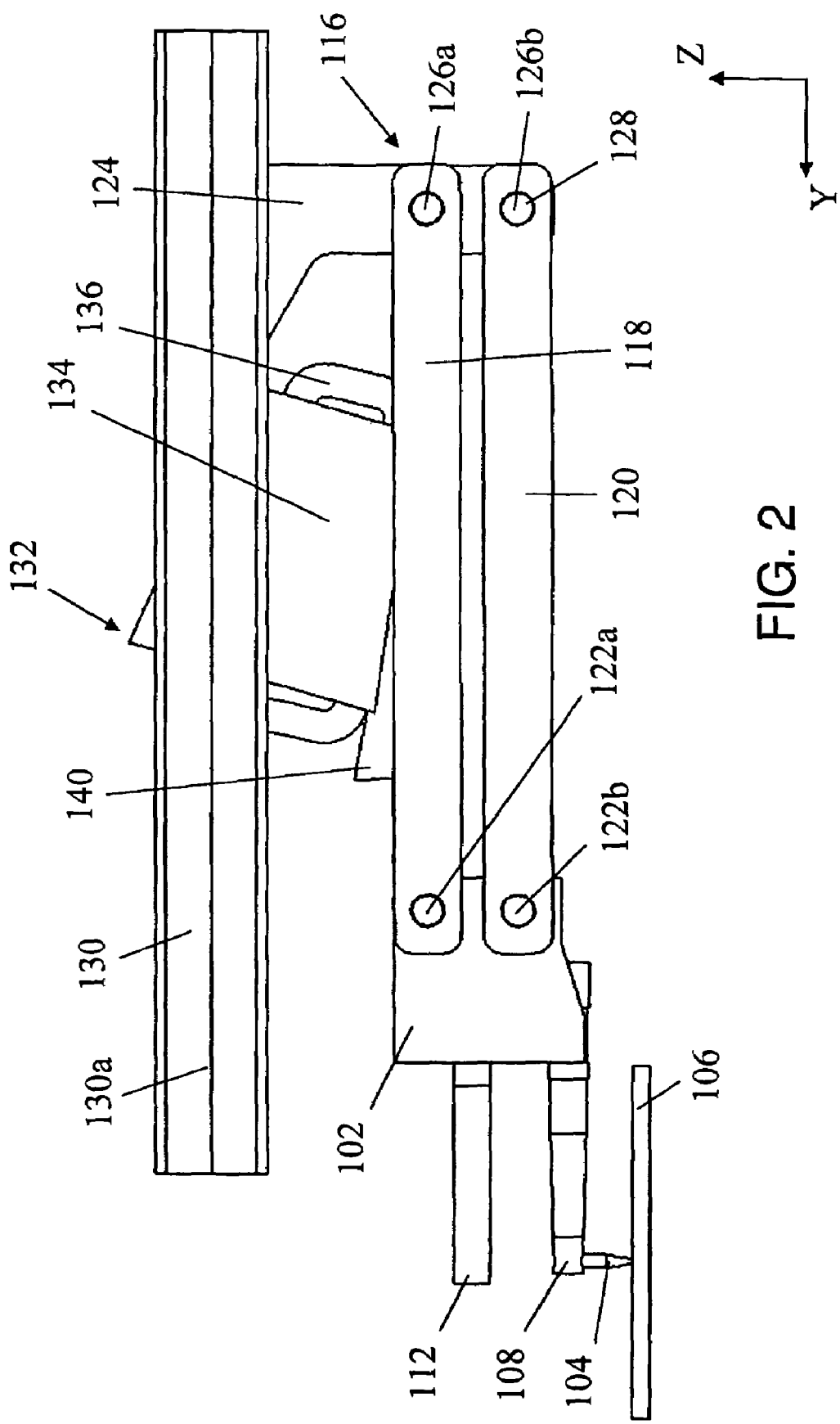
FIG. 2 is a side elevation view of the bond head assembly of FIG. 1.

The bond head assembly 100 preferably includes a drive system 132 for raising and lowering the tool support member 102 with respect to the work piece 106. The drive system 132 includes a pair of permanent magnets 134 and an energizable coil 136 located in a space defined between the magnets 134. The magnets 134 of the depicted drive system 132 are partially received by a central aperture 138 of slide member 130. Referring to FIG. 2, a coil support member 140 supports the coil 136 and is coupled between the coil 136 and the upper arm link 118 of link assembly 116. The drive system 132 provides a magnetic circuit in which electromagnetic interaction between the coil 136, when energized, and the permanent magnets 134 drives the link assembly 116 with respect to the slide member 130 to raise and lower the tool support member 102.

It is not required that the drive system be located between the pivot axes 122a, 122b, 126a, 126b, as shown, or that the drive system engage the upper arm link 118. As an alternative example, the drive system could be located rearwardly of pivot axes 126a, 126b, opposite tool support member 102, and could drivingly engage the lower arm link 120. Although such an arrangement may require increased power for driving the link assembly 116, it might be desirable for reasons of balance and dynamic stability. Also, although the depicted drive system 132 includes a pair of permanent magnets 134 and an intermediate coil 136, alternative systems for moving the link assembly with respect to a wire bonding machine are contemplated.

Figure 3:
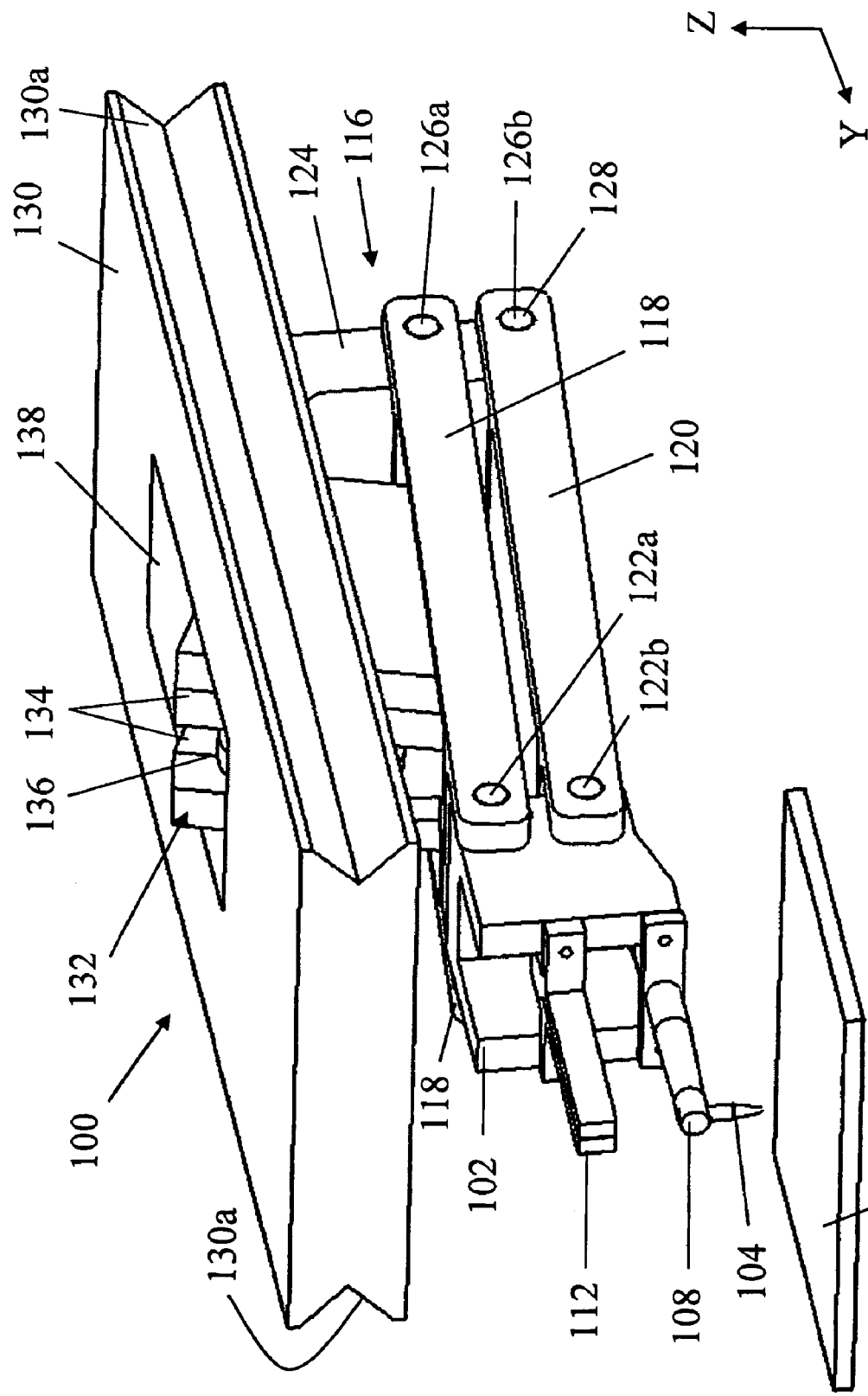
FIG. 3 is a perspective view of the bond head assembly of FIG. 1, the assembly shown in a raised position with respect to the work piece.
Figure 4:
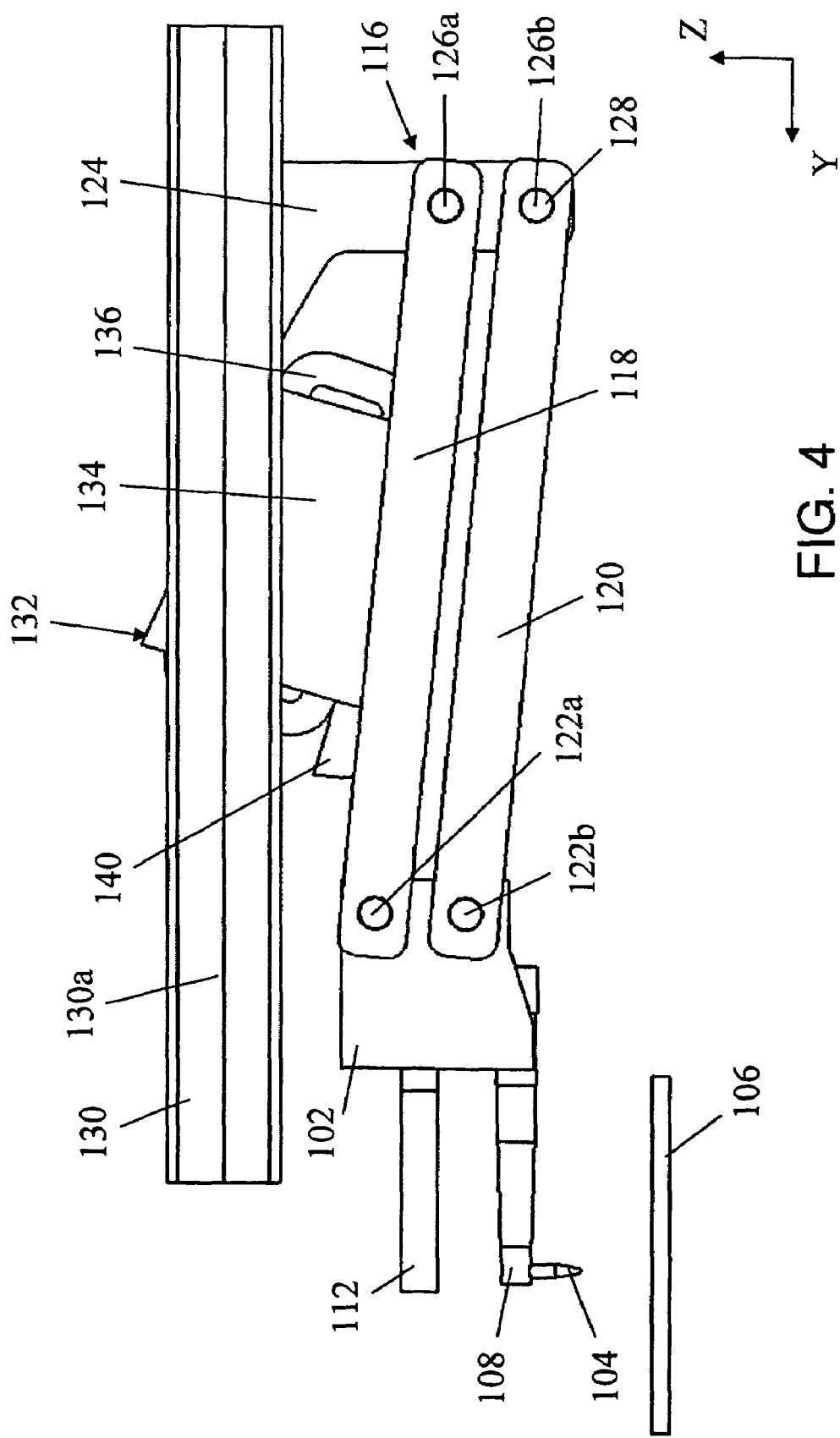
FIG. 4 is a side elevation view of the bond head assembly of FIG. 3.

Referring to FIGS. 1 and 2, the bond head assembly 100 is shown in a lowered position with respect to the work piece 106 such that the capillary 104 carried by the tool support member 102 is positioned for direct or indirect contact with work piece 106. Referring to FIGS. 3 and 4, the link assembly 116 has been driven by drive system 132 to pivot the arm links 118, 120 in a clockwise direction from the point of view shown in the drawings. As shown, the pivoting of the arm links 118, 120 with respect to the frame member 124 raises the tool support member 102 to separate the capillary 104 from the work piece 106.

The upper and lower arm links 118, 120 of the link assembly 116 are dimensioned in length such that the pivot locations 122a, 122b, 126a, 126b are located adjacent the ends of the arm links 118, 120. It should be understood, however, that one or both of the arm links 118, 120 could have end portions that extend beyond the pivot locations.

As shown by comparing FIGS. 2 and 4, the angular orientation of the tool support member 102 remains substantially constant during the movement of the link assembly 116 between the lowered and raised positions. As a result, the vertical orientation of the capillary 104 remains substantially constant. Thus, the orthogonality of the capillary 104 with respect to the work piece 104 is maintained throughout the range of motion of the link assembly 116. Because the orthogonality of the capillary 104 is maintained, the path of the bond wire being fed through the capillary 104 remains the same regardless of the direction in which the tool support member 102 is translated by the wire bonding machine during the formation of a loop. This uniformity in the capillary orientation desirably promotes loops of consistent shape.

The depicted link assembly 116 includes a pair of substantially parallel arm links 118, 120. The bond head assembly could conceivably include additional substantially parallel arm links pivotably connected to the tool support member 102.

Referring to FIG. 2, the distance between the pivot locations 122a and 126a defines a pivot length for upper arm link 118. Similarly, the distance between the pivot locations 122b and 126b defines a pivot length for the lower arm link 120. The pivot length of each arm link 118, 120 determines a travel trajectory that will be followed by the respective pivot location 122a, 122b during movement of the linkage assembly 116 between the lowered and the raised positions. The link assembly 116 of bond head assembly 100 functions to provide substantially constant angular orientation of the tool support member 102 because the pivot length of arm link 118 is substantially equal to the pivot length of arm link 120. As a result, the trajectory of the pivot locations 122a, 122b of arm links 118, 120 will be substantially equal.

Although a parallelogram mechanism provides certain benefits, the present invention is not so limited. By adjusting the pivot lengths of the arm links, a four-bar mechanism can be tailored to provide certain desired features. As described above, for example, the parallelogram mechanism undesirably includes a horizontal component in the motion of the tool support member. If linear motion (e.g., vertical only) of a supported capillary is desired, the parallelogram mechanism may be simultaneously translated to null out the horizontal component of the tool motion.

An exemplary method of adjusting a four-bar link mechanism to achieve a desired feature associated with the mechanism motion is as follows. In the following discussion, the link mechanism includes first and second arm links each defining first and second locations respectively adapted for pivotable connection to a frame and to a tool support member. The pivot length of each arm link is defined by the distance between the first and second locations of the arm link.

The pivot length of the first arm link is selected to determine a trajectory for the second location of the first arm when the first arm is pivoted with respect to the frame. With the trajectory of the first arm established, the pivot length for the second arm link is selected to cause the tool support member to pivot with respect to the frame by a preselected angle during a range of motion of the mechanism between a lowered position and a raised position.

The tool support member supports a wire bonding tool, such as a capillary, at a distance from the second location of the first arm. The pivoting of the tool support member with respect to the frame causes the capillary to experience a tool pivoting motion about the second location of the first arm. The pivot angle of the tool support member is selected to provide a certain tool pivoting motion about the second location of the first arm providing a desirable kinematic or inertial feature for the four-bar link mechanism.

Figure 5:
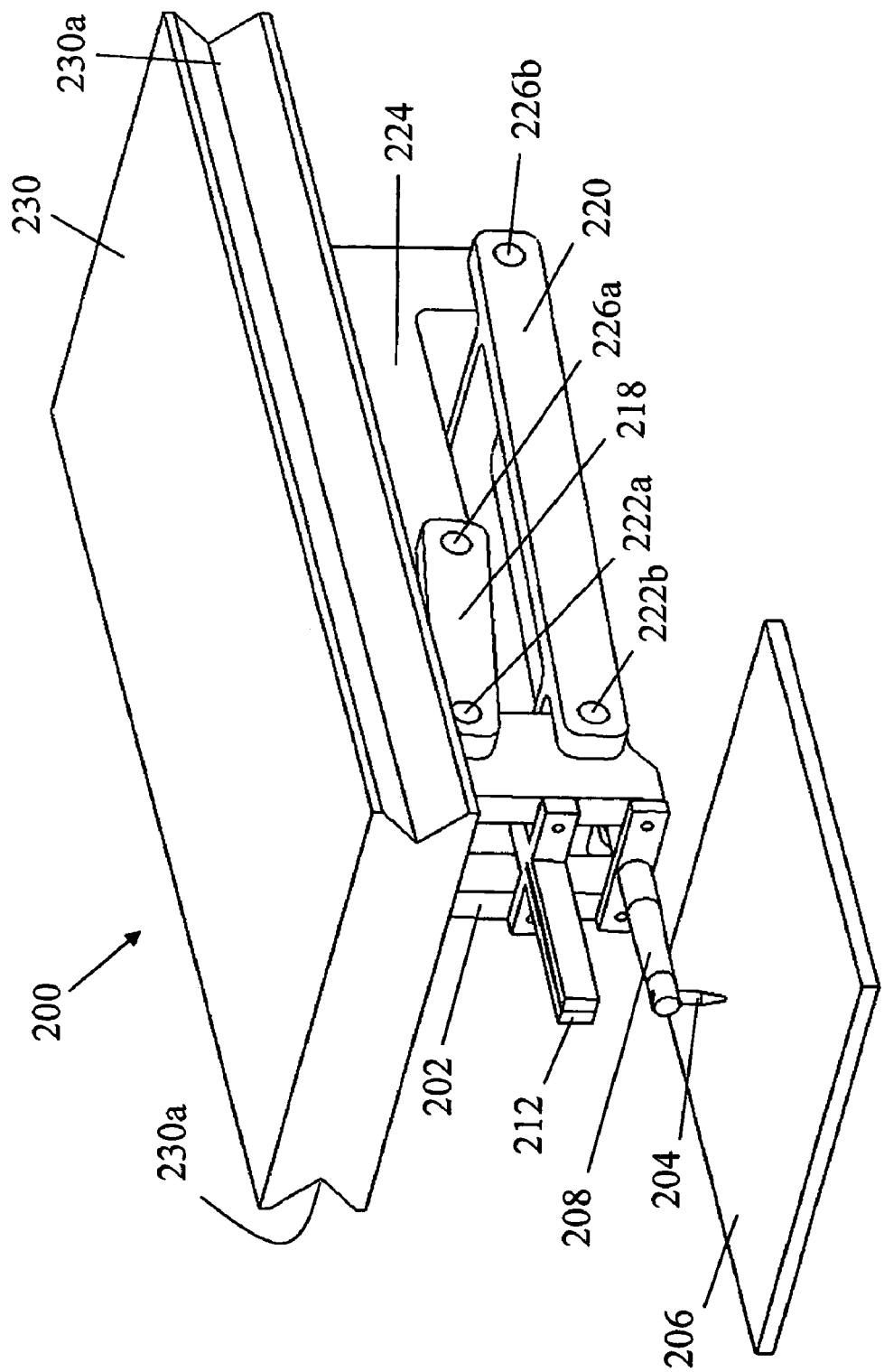
FIG. 5 is a perspective view of a bond head assembly for a wire bonding machine according to a second exemplary embodiment of the invention.

Referring to FIG. 5, there is shown a bond head assembly 200 according to a second exemplary embodiment of the present invention in which arm pivot length has been adjusted to provide substantially linear motion of a supported capillary 204. A linear Z-axis motion of the wire bonding tool 104 desirably simplifies control over the motion of the wire bonding tool compared to non-linear motion of prior machines requiring simultaneous translation.

Similar to the first exemplary bond head assembly 100, the bond head assembly 200 includes a tool support member 202 for supporting the capillary 204 and moving the capillary with respect to an underlying work piece 206 between raised and lowered positions. The bond head assembly 200 includes a transducer 208 engaging the capillary 204 and a wire clamp 212. The bond head assembly 200 is depicted without a drive system for raising and lowering the mechanism, it being understood that any suitable means of moving the mechanism to raise and lower the wire bonding tool 204 could be used.

The tool support member 202 forms a coupling link of a four-bar mechanism with upper and lower arm links 218, 220 and a frame member 224. The upper and lower arm links 218, 220 are pivotably connected to the frame member 224 for pivot about pivot axes at locations 226a, 226b, respectively. The upper and lower arm links 218, 220 are also pivotably connected to the tool support member at locations 222a, 222b, respectively.

Similar to frame member 124 of bond head assembly 100, the frame member 224 of the depicted bond head assembly 200 extends downwardly from a lower surface of a slide member 230 of a linear slide mechanism defining opposite V-shaped grooves 230a. Frame member 224 includes a forwardly extending portion to which the upper arm link 218 is connected such that the pivot axis location 226a of upper arm link 218 is located forwardly of the pivot axis location 226b for lower arm link 220. This differs from the construction of bond head assembly 100, as shown in FIG. 2, in which the pivot axis locations 126a, 126b of upper and lower arm links 118, 120 are aligned in substantially vertical fashion.

As a result of the forward location of location 226a with respect to 226b, the arm pivot length for upper link 218 defined between locations 222a, 226a is shorter than that for lower link 220, which is defined between locations 222b, 226b.

Referring to FIGS. 6A through 6C, the bond head assembly 200 is respectively shown in a lowered position, a partially-raised position and a fully-raised position with respect to the work piece 206. In the lowered position of FIG. 6A, the upper and lower arm links 218, 220 are substantially parallel to each other. As shown in FIGS. 6B and 6C, however, the differing arm pivot lengths for upper and lower arm links 218, 220, results in differing amount of pivot for the upper and lower arm links 218, 220. As a result, the upper and lower arm links 218, 220 do not remain parallel to each other throughout the entire range of motion of the mechanism. As a result, the tool support member 202 pivots with respect to the frame member 224 during the motion of the four-bar mechanism.

Comparing FIGS. 6A and 6C, the lower link 220 pivots about location 226b such that location 222b of lower link 220 travels along a trajectory including both vertical and horizontal components. From the point of view of the figures, the horizontal component of the trajectory of location 222b will be to the right as the mechanism is moved between the lowered position of FIG. 6A and the raised position of FIG. 6B. As may also be seen by comparing FIGS. 6A and 6C, the tool support member 202 pivots about location 222b as the mechanism moves between the lowered and raised positions. From the point of view of the figures, the pivoting of the tool support member 202 about location 222b is in a clockwise direction.

The capillary 204 of the bond head assembly 200 is supported at a distance from location 222b of lower arm link 220. As a result, the capillary will experience a tool pivoting motion with respect to location 222b having both horizontal and vertical components. From the point of view of the FIGS. 6A through 6C, the horizontal component of the tool pivoting motion will be to the left. Thus, the horizontal component of the tool pivoting motion is in a direction that is opposite to the horizontal component of the trajectory for location 222b of lower link 220.

The pivot angle of the tool support member 202 with respect to location 222b was selected such that the horizontal component of the tool pivoting motion is substantially equal to the horizontal component of the lower link trajectory. Thus, the horizontal motion of the capillary 204 is nulled to provide substantially linear (i.e., only vertical) motion of the capillary, as shown by the vertical line extending through each of FIGS. 6A through 6C.

Although the angular orientation of the tool support member 202 is not constant, the pivot angle of the tool support member 202 about the location 222b is small, less than approximately 1 degree. Thus, the supported capillary 204 will remain substantially orthogonal to the work piece 206 during the motion of the bond head assembly 200.

Although the depicted bond head assembly 200 includes a shortened arm pivot length for the upper arm link 218 compared to that of the lower arm link 220, the invention is not so limited. Alternative configurations are contemplated, for example, the pivot arm length for the lower arm link 220 could be shortened with respect to that of the upper arm link 218.

For each of bond head assembly 100 and bond head assembly 200, the upper and lower arm links are substantially parallel to each other in the lowered position with respect to the work piece 206 (i.e., when the capillary 204 is positioned for contacting the work piece 206 either directly or indirectly through a bonding wire). As shown, the links are also substantially parallel to a bond plane defined by the work piece 206 in the lowered position such that the capillary 204 will be orthogonal to the bond plane. A bond force is typically applied to the capillary 204 during contact between the capillary 204 and the work piece 206. The application of bond force to the capillary causes a deflection of the mechanism in response. Because the links are parallel in the lowered position and the capillary is orthogonal, the responsive deflection of the mechanism will be substantially vertical. Thus, there is no lateral motion of the bonding tool during the application of bond force. The lack of lateral motion during the application of bond force desirably limits damage to the resulting bonds caused by tool "skidding." Although parallelism of the link arms 218, 220 in the lowered position is preferable, other arrangements are conceived in which the links are non-parallel in the tool contact position.

Referring to FIGS. 7A through 7C, various features and benefits of the above-described embodiments are illustrated graphically. The graphs of FIGS. 7A through 7C illustrate tool pivot angle and tool horizontal movement during link assembly movement for the bond head assembly 100 of FIG. 1, the bond head assembly 200 of FIG. 5, and a prior bond head linkage assembly, respectively. Referring to FIG. 7A, the bond head assembly 100 of FIG. 1 is adapted to raise the associated capillary 104 to a vertical position of approximately 320 mils. During the movement of the capillary from the lowered position of zero mils to the raised position of approximately 320 mils, the capillary is moved approximately 17 mils horizontally. As shown, however, the tool pivot angle during the mechanism motion is substantially equal to zero. For this embodiment, if linear movement (e.g., only vertical) is desired, the bond head 100 may be simultaneously translated to compensate for the horizontal component.

Referring to FIG. 7B, the tool pivot angle and tool horizontal movement for bond head assembly 200 is illustrated. As described above, the horizontal components of the lower arm link trajectory and the tool pivoting motion are substantially equal and opposite such that horizontal movement of the tool 204 with respect to work piece 206 is substantially equal to zero. The arrangement of the link assembly of bond head assembly 200, therefore, represents a compromise in which a slight amount of tool pivot is permitted to substantially eliminate horizontal tool movement within the range of mechanism motion that is desired.

The respective benefits of the bond head assemblies 100 and 200 can be seen by comparing FIGS. 7A and 7B with the graph of FIG. 7C, which illustrates tool pivot angle and tool horizontal movement for a prior bond head assembly. As shown, the supported tool undesirably experiences both pivot angle and horizontal displacement, with the tool displacing approximately 17 mils during mechanism motion and pivoting in excess of 5 degrees.

In the above description of the bond head assembly 200, and the associated method of configuring the link mechanism by varying pivot length, a desired objective is to null horizontal movement of the supported capillary 204. It should be understood, however, that the method could be used to achieve desired benefits other than or in addition to the above-described kinematic benefit of nulled horizontal tool movement, such as to provide optimized inertial characteristics or power requirements, for example.

The wire bonding tool of a wire bonding machine is typically accelerated from its lowered contact position to provide for looping or to provide access to form a free air ball for a ball bonding machine. Given the high speeds that are desired, this acceleration may be substantial. From an inertial standpoint, support of a wire bonding tool at the terminal end of a pivoting tool arm, as provided by the prior bond head assembly of FIG. 7C for example, ideally distributes the mass that must be accelerated by a drive system to achieve the desired speeds. Such inertial benefits, in turn, promote reduced power requirements. The desirable inertial/power characteristics (i.e., pure pivot and distributed mass) associated with the construction of FIG. 7C may be contrasted to those of a purely translating system (e.g., an elevator), in which mass is concentrated. In a purely translating system, the entire mass of the system is accelerated together as a unit along a vertical travel path. As illustrated in FIG. 7C, however, the support of the tool by the pivoting tool arm of the prior bond head assembly undesirably results in pivoting of the tool, and horizontal translation of the tool, in addition to the desired vertical motion.

The parallelogram construction of bond head assembly 100 results in some concentration of mass adjacent the capillary 104 associated with the tool support member 102. In other words, there is a trade-off from an inertial/power standpoint between the purely pivoting construction of the prior wire bonding machine of FIG. 7C and bond head assembly 100 in order to provide the non-pivoting tool feature.

As described above, the bond head assembly 200 involves a compromise from bond head assembly 100 from a kinematic standpoint because the tool 204 is permitted to pivot to some extent to achieve the desired nulling of horizontal motion. The inertia/power characteristics associated with bond head assembly 200, however, are improved to some extent from those of bond head assembly 100. Referring again to FIGS. 6A and 6C, the pivoting of the tool support member 202 with respect to location 222b results in a tool pivoting motion of capillary 204 having both horizontal and vertical components. From the point of view of FIGS. 6A through 6C, the vertical component of the tool pivot motion is upwards as the mechanism is moved from the lowered position to the raised position. Therefore, the vertical component of the tool pivoting motion is in the same direction as the vertical component of the lower arm link trajectory. Because the vertical components are in the same direction, they are additive. Thus, the range of motion of the mechanism achieving a given amount of vertical tool displacement has been reduced from that of the parallelogram structure, thereby reducing power requirements.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A bond head assembly for use with a wire bonding machine, the bond head assembly comprising:
   a wire bonding tool; and
   a link mechanism coupled between the wire bonding tool and the wire bonding machine, the link mechanism including a frame, a plurality of arm links pivotably connected to the frame, and a coupler link pivotably connected to each of the arm links, the coupler link supporting the wire bonding tool, the arm links being substantially parallel to each other in at least one position of the link mechanism within a range of motion of the link mechanism, the plurality of arm links including (1) a first arm link having a first pivot length and (2) a second arm link having a second pivot length, the first pivot length being different from the second pivot length.

2. The bond head assembly according to claim 1 further comprising a drive system engaging the link mechanism to pivot the arm links with respect to the frame.

3. The bond head assembly according to claim 2, wherein the drive system includes a magnetic circuit coupled to the link mechanism.

4. The bond head assembly according to claim 3, wherein the magnetic circuit includes a pair of permanent magnets and an energizable coil located in a space defined between the pair of permanent magnets.

5. The bond head assembly according to claim 1, wherein the arm links are substantially parallel to each other in any position of the link mechanism within the range of motion of the link mechanism.

6. The bond head assembly according to claim 1, wherein the second arm link is positioned above the first arm link with respect to a bonding area of the wire bonding machine, the first pivot length being greater than the second pivot length.

7. The bond head assembly according to claim 1 further comprising a transducer coupled between the wire bonding tool and the coupler link of the link mechanism.

8. The bond head assembly according to claim 1 wherein the first pivot length is defined between first and second locations of the first arm, such that during pivoting of the first arm a trajectory for the second location of the first arm is defined, the trajectory having vertical and horizontal components, the second pivot length being defined between first and second locations of the second arm, the second pivot length being less than the first pivot length such that pivoting of the tool support member with respect to the frame results in a tool pivoting motion of the tool with respect to the first arm that includes a horizontal component, the horizontal components of the trajectory and the tool pivoting motion being substantially equal and opposite to each other to provide substantially linear movement of the wire bonding tool.

* * * * *